United States Patent
Sato et al.

(10) Patent No.: US 10,332,725 B2
(45) Date of Patent: Jun. 25, 2019

(54) SYSTEMS AND METHODS FOR REVERSING RF CURRENT POLARITY AT ONE OUTPUT OF A MULTIPLE OUTPUT RF MATCHING NETWORK

(71) Applicant: LAM RESEARCH CORPORATION, Fremont, CA (US)

(72) Inventors: Arthur H. Sato, San Jose, CA (US); Maolin Long, Santa Clara, CA (US); Alex Paterson, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 798 days.

(21) Appl. No.: 14/673,174

(22) Filed: Mar. 30, 2015

(65) Prior Publication Data

US 2016/0293382 A1  Oct. 6, 2016

(51) Int. Cl.
| | |
|---|---|
| C23C 16/00 | (2006.01) |
| C23F 1/00 | (2006.01) |
| H01L 21/306 | (2006.01) |
| H01J 37/32 | (2006.01) |

(52) U.S. Cl.
CPC ..... *H01J 37/3211* (2013.01); *H01J 37/32174* (2013.01)

(58) Field of Classification Search
USPC ........ 118/723 I, 723 IR; 156/345.48, 345.49; 315/111.51
See application file for complete search history.

(56) References Cited

U.S. PATENT DOCUMENTS

| | | | | |
|---|---|---|---|---|
| 5,401,350 | A | | 3/1995 | Patrick et al. |
| 5,578,165 | A | | 11/1996 | Patrick et al. |
| 5,589,737 | A | | 12/1996 | Barnes et al. |
| 6,028,395 | A | * | 2/2000 | Holland ................ H01J 37/321 315/111.51 |
| 6,096,174 | A | * | 8/2000 | Teschner ............. C23C 14/3464 204/192.12 |
| 6,153,990 | A | * | 11/2000 | Feil .......................... H01H 9/38 318/280 |
| 2003/0111181 | A1 | * | 6/2003 | Wang .................... H01J 37/321 156/345.48 |
| 2009/0000738 | A1 | * | 1/2009 | Benjamin ............. H01J 37/321 156/345.28 |

(Continued)

FOREIGN PATENT DOCUMENTS

CN    201499116 U    *   6/2010

OTHER PUBLICATIONS

Model for a Large Area Multi-frequency Multiplanar Coil Inductively Coupled Plasma Source; Naoki, Yamada; J. Vac. Sci. Technol. A 14(5); 1996.

(Continued)

*Primary Examiner* — Rakesh K Dhingra

(57) ABSTRACT

A substrate processing tool for processing a substrate includes a processing chamber including a substrate support. First and second coils are arranged outside of the processing chamber. Each of the first and second coils includes first and second conductors. A coil driving circuit drives current through the coils to generate plasma in the processing chamber. A coil reversing circuit is configured to selectively reverse a polarity of current flowing through the first and second conductors of the first coil. The coil reversing circuit includes an H-bridge circuit.

18 Claims, 6 Drawing Sheets

(56) References Cited

U.S. PATENT DOCUMENTS

| | | |
|---|---|---|
| 2011/0094994 A1* | 4/2011 | Todorow ............... H01J 37/321 216/68 |
| 2013/0106286 A1 | 5/2013 | Banna et al. |
| 2013/0134129 A1 | 5/2013 | Todorow et al. |
| 2013/0135058 A1 | 5/2013 | Long |

OTHER PUBLICATIONS

"H Bridge." Wikipedia. Wikimedia Foundation, n.d. Web. Dec. 15, 2014, 5 pages.

* cited by examiner

SYSTEMS AND METHODS FOR REVERSING RF CURRENT POLARITY AT ONE OUTPUT OF A MULTIPLE OUTPUT RF MATCHING NETWORK

FIELD

The present disclosure relates to substrate processing systems, and more particularly to substrate processing systems using inductively coupled plasma.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are typically used to deposit and etch thin film on substrates such as semiconductor wafers. Examples of etching include wet chemical etching and dry etching. Dry etching may be performed using plasma generated by inductively-coupled plasma (ICP). The inductively-coupled plasma may be generated by coils arranged outside of a processing chamber adjacent to a dielectric window. Process gas flowing inside the processing chamber is ignited to create plasma.

Some ICP systems use two coils and flow current in the same direction in both coils. Etch rate maps tend to show an "M" shape etch pattern on the substrate surface where the maximum etch rate is at a mid-radius. The non-uniformity is generally not acceptable for some processes.

SUMMARY

A substrate processing tool for processing a substrate includes a processing chamber including a substrate support. First and second coils are arranged outside of the processing chamber. Each of the first and second coils include first and second conductors. A coil driving circuit drives current through the coils to generate plasma in the processing chamber. A coil reversing circuit is configured to selectively reverse a polarity of current flowing through the first and second conductors of the first coil. The coil reversing circuit includes an H-bridge circuit.

In other features, the H-Bridge circuit includes a double-pole, double-throw relay. The H-Bridge circuit includes a first single-pole, double-throw relay and a second single-pole, double-throw relay. The H-Bridge circuit includes first, second, third and fourth switches and a controller configured to selectively switch states of the first, second, third and fourth switches.

In other features, the first, second, third and fourth switches include field effect transistors (FETs). The first, second, third and fourth switches include PIN diodes. The H-Bridge circuit includes a rotary switch. The H-Bridge circuit includes first, second third and fourth variable vacuum capacitors and a motor driver configured to drive gears to selectively adjust an impedance of the first, second third and fourth variable vacuum capacitors.

In other features, the H-Bridge circuit includes first, second third and fourth variable impedance circuits and a controller configured to selectively adjust an impedance of the first, second third and fourth variable impedance circuits.

In other features, the first, second third and fourth variable impedance circuits include a variable capacitance. The first, second third and fourth variable impedance circuits include a first variable capacitance in series with a parallel combination of a second variable capacitance and an inductance.

In other features, the coil driving circuit includes an RF source and a tuning circuit in communication with the RF source, the coil reversing circuit and the second coil. The tuning circuit includes a transformer capacitively coupled tuning circuit. The first coil is arranged inside of the second coil. The first coil is arranged outside of the second coil.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure relates to a reversing circuit in an inductively coupled plasma substrate processing system. In some examples, the reversing circuit uses one or more H-bridge circuits to switch RF current polarity or phasing of one of the coils to allow processes to run with coil currents flowing in parallel and antiparallel directions. The dual current mode allows legacy process recipes and new process recipes to take advantage of RF current polarity-reversed modes for improved etch rate uniformity.

Figure 1:
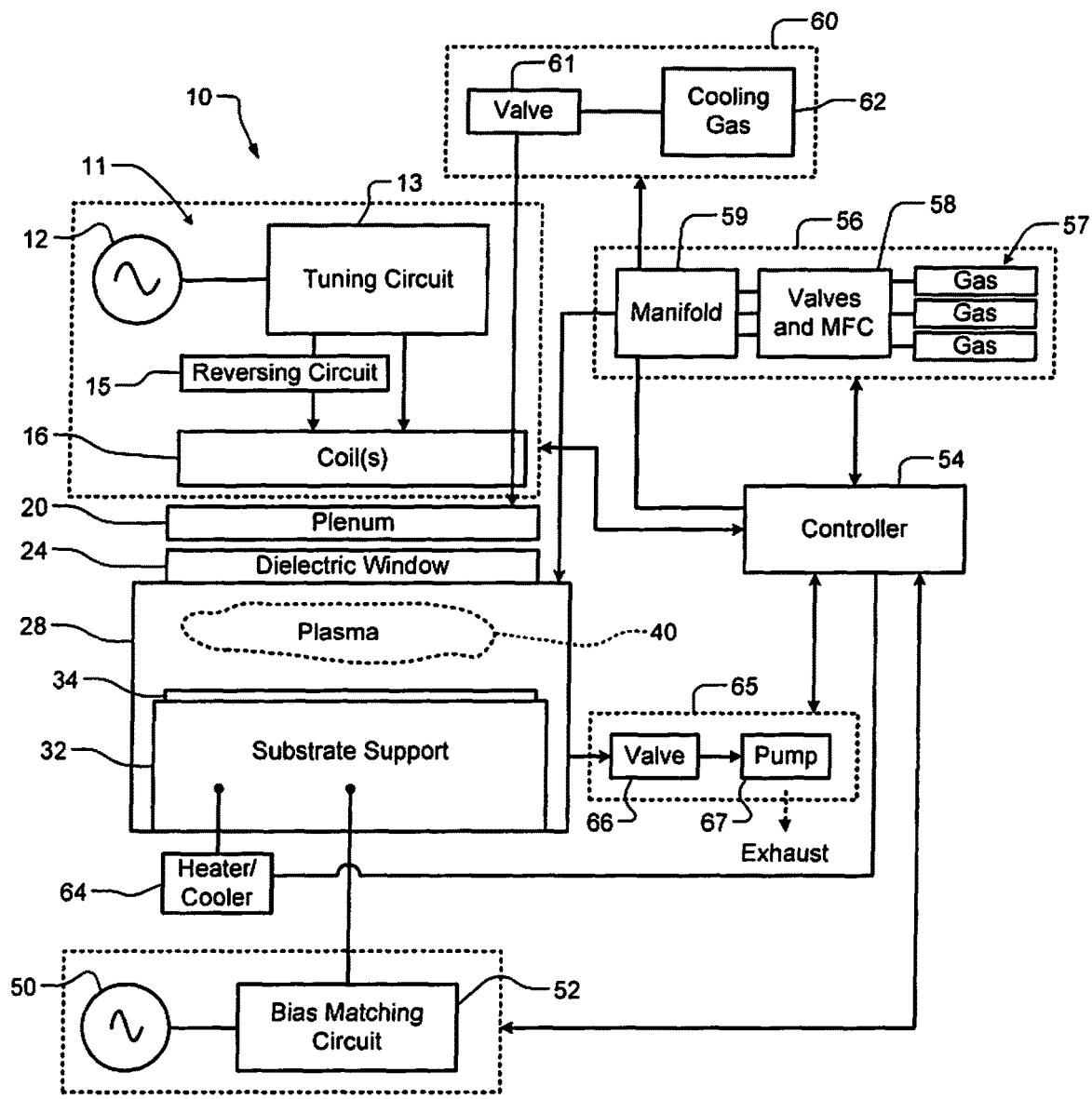
FIG. 1 is a functional block diagram of an example of an inductively coupled plasma (ICP) substrate processing system according to the present disclosure.

Referring now to FIG. 1, an example of a substrate processing system 10 according to the present disclosure is shown. The substrate processing system 10 includes a coil driving circuit 11. In some examples, the coil driving circuit 11 includes an RF source 12 and a tuning circuit 13. The tuning circuit 13 may be directly connected to one or more coils 16 or connected by a coil reversing circuit 15 to one or more coils 16. The tuning circuit 13 is used to tune an output of the RF source 12 to a desired frequency and/or a desired phase. The coil reversing circuit 15 is used to selectively switch the polarity of current through one or more of the coils 16.

In some examples, a gas plenum 20 may be arranged between the coils 16 and a dielectric window 24. The dielectric window 24 is arranged along one side of a processing chamber 28. The processing chamber 28 further comprises a substrate support 32. The substrate support 32 may include an electrostatic chuck, a mechanical chuck or other type of chuck. Process gas is supplied to the processing chamber 28 and plasma 40 is generated inside of the processing chamber 28. The plasma 40 etches an exposed surface of the substrate 34. An RF source 50 and a bias matching circuit 52 may be used to bias the substrate support 32 during operation.

A gas delivery system 56 may be used to supply a process gas mixture to the processing chamber 28. The gas delivery system 56 may include process and inert gas sources 57, a gas metering system 58 such as valves and mass flow controllers, and a manifold 59. A gas delivery system 60 may be used to deliver gas 62 via a valve 61 to the gas plenum 20. The gas may include cooling gas that is used to cool the coils 16 and the dielectric window 24. A heater 64 may be used to heat the substrate support 32 to a predetermined temperature. An exhaust system 65 includes a valve 66 and pump 67 to remove reactants from the processing chamber 28 by purging or evacuation.

A controller 54 may be used to control the etching process. The controller 54 monitors system parameters and controls delivery of the gas mixture, striking, maintaining and extinguishing the plasma, removal of reactants, supply of cooling gas, etc.

Figure 2:
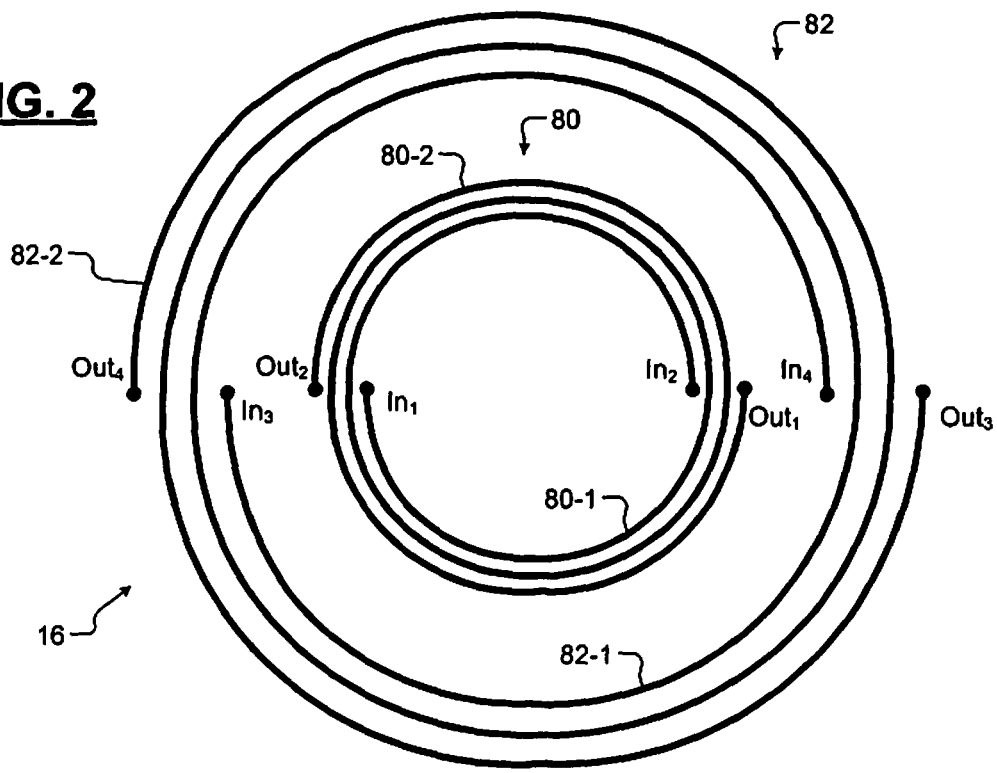
FIG. 2 is a plan view of an example of inner and outer coils.

Referring now to FIG. 2, an example of the coil 16 is shown. The coil 16 may include an inner coil 80 and an outer coil 82. The inner coil 80 includes a first conductor 80-1 having an input end In1 and an output end Out1 and a second conductor 80-2 having an input end In2 and an output end Out2. The first conductor 80-1 and the second conductor 80-2 are wound in a generally circular or looped path adjacent to each other. The outer coil 82 includes a first conductor 82-1 having an input end In3 and an output end Out3 and a second conductor 82-2 having an input end In4 and an output end Out4. The first conductor 82-1 and the second conductor 82-2 are wound in a generally circular or looped path adjacent to each other.

In some examples, the tuning circuit 13 may include a transformer-coupled capacitive tuning circuit (TCCT), which is connected to first and second coils 16, although other types of tuning circuits can be used. The TCCT circuit typically includes one or more fixed or variable capacitors. An example of a TCCT circuit is shown and described in commonly assigned U.S. Publication No. 2013/0135058 to Long et al., which is hereby incorporated by reference in its entirety.

Figure 3:
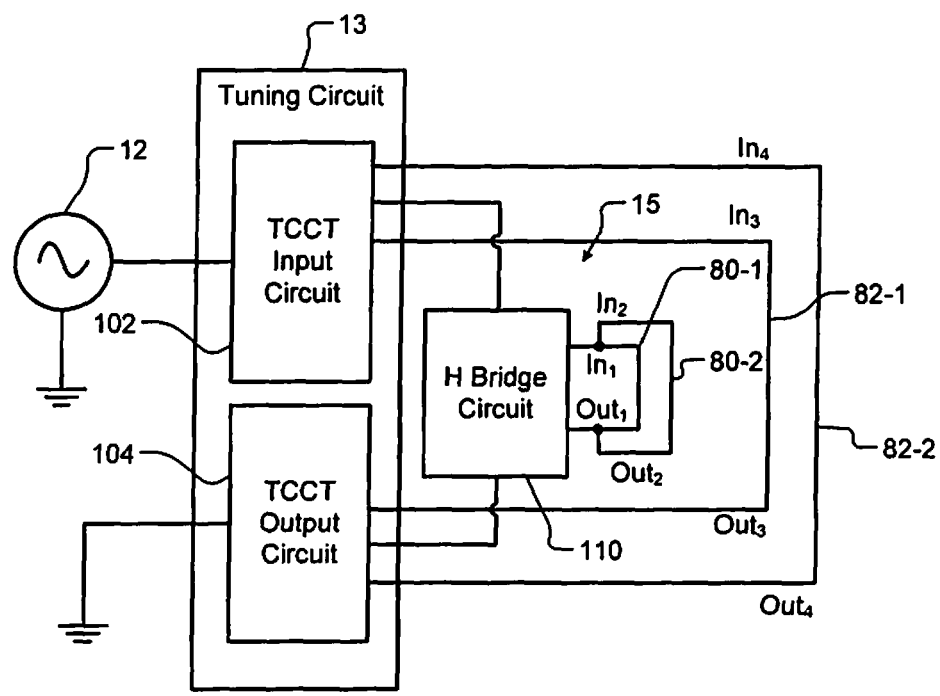
FIG. 3 is electrical schematic of an example of a coil reversing circuit including H-bridge circuits according to the present disclosure.

Referring now to FIG. 3, the coil reversing circuit 15 is shown to include an H-bridge circuit. The tuning circuit 13 is shown to include a TCCT input circuit 102 and a TCCT output circuit 104. At least some of the coils 16 are connected to the coil reversing circuit 15 between the TCCT input circuit 102 and the TCCT output circuit 104. For example only, the coil reversing circuit 15 may include an H-bridge circuit 110. The H bridge circuit 110 is connected between the TCCT input circuit 102, the first conductor 80-1 of the inner coil 80 and the TCCT output circuit 104 and between the TCCT input circuit 102, the second conductor 80-2 of the inner coil 80 and the TCCT output circuit 104.

While the coil reversing circuit 15 is shown connected to the inner coil 80 in FIG. 3, the coil reversing circuit 15 may optionally be connected to the outer coil 82 or connected to both the inner coil 80 and the outer coil 82 (so that a reversing selection can be made between the inner coil 80 and the outer coil 82). As will be described further below, the coil reversing circuit 15 selectively switches the polarity of current flowing through the conductors 80-1 and 80-2 of the inner coil 80.

Figure 4A:
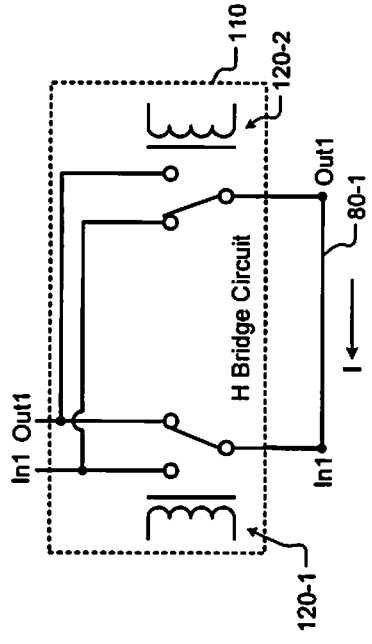
FIGS. 4A and 4B are electrical schematics of an example of an H-bridge circuit including a relay.
Figure 4B:
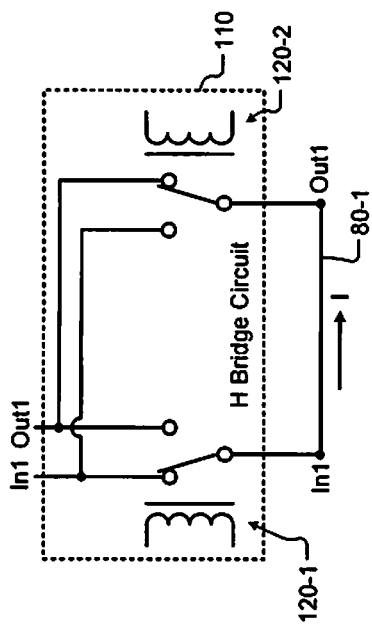

Referring now to FIGS. 4A and 4B, the H-bridge circuit 110 includes relays 120-1 and 120-2. As can be appreciated, current reversal through one of the conductors 80-1 of the inner coil 80 is shown. A similar approach can be used to reverse current flowing through other conductors of other coils.

In FIG. 4A, the relays 120-1 and 120-2 are shown in a first state to flow current through the conductor 80-1 in a first direction from the input end $In_1$ to the output end $Out_1$. In FIG. 4B, the relays 120-1 and 120-2 are shown in a second state to flow current through the conductor 80-1 in a second direction from the output end $Out_1$ to the input end $In_1$. While high-voltage, high-current single-pole, double-throw relays are shown, a high-voltage, high-current double-pole, double-throw relay may be used.

Figure 5A:
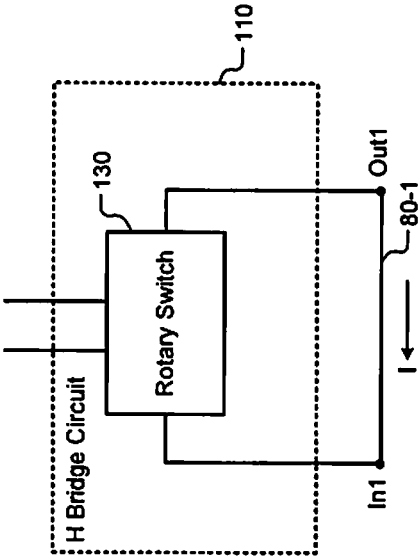
FIGS. 5A and 5B are electrical schematics of an example of an H-bridge circuit including a rotary switch.
Figure 5B:
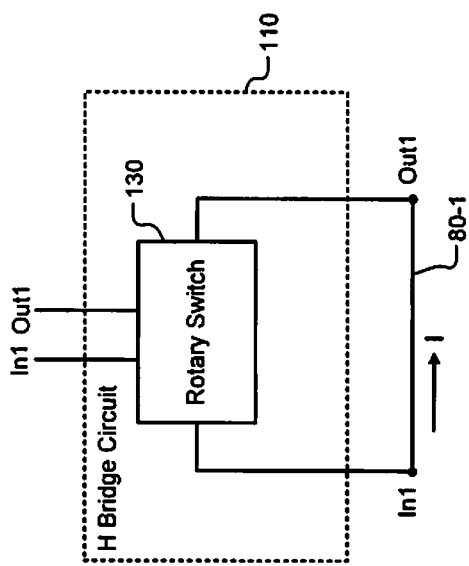

Referring now to FIGS. 5A and 5B, the H-bridge circuit 110 includes a rotary switch 130. In FIG. 5A, the rotary switch 130 is shown in a first state to flow current through the conductor 80-1 in a first direction from the input end $In_1$ to the output end $Out_1$. In FIG. 5B, the rotary switch 130 is shown in a second state to flow current through the conductor 80-1 in a second direction from the output end $Out_1$ to the input end $In_1$. In some examples, the rotary switch 130 includes a two-pole, two-position rotary switch capable of withstanding high voltage and high current.

Figure 6B:
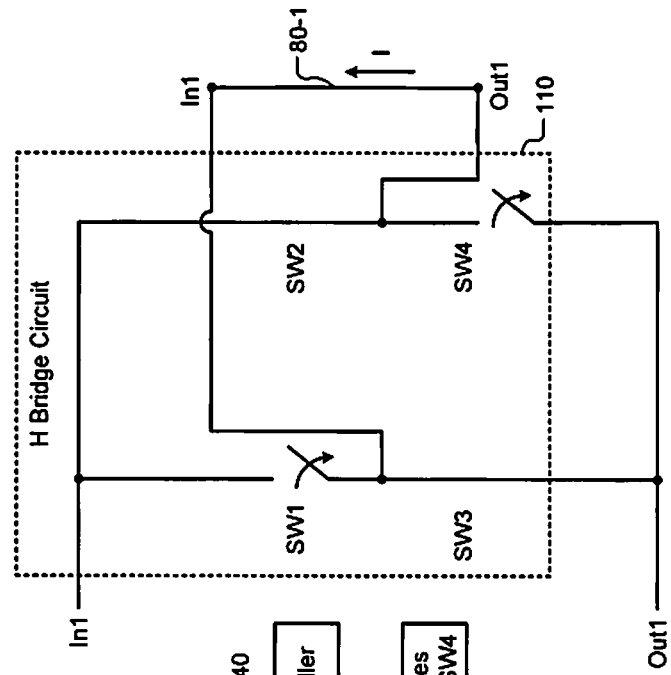
FIGS. 6A and 6B are electrical schematics of an example of an H-bridge circuit including switches.
Figure 6A:
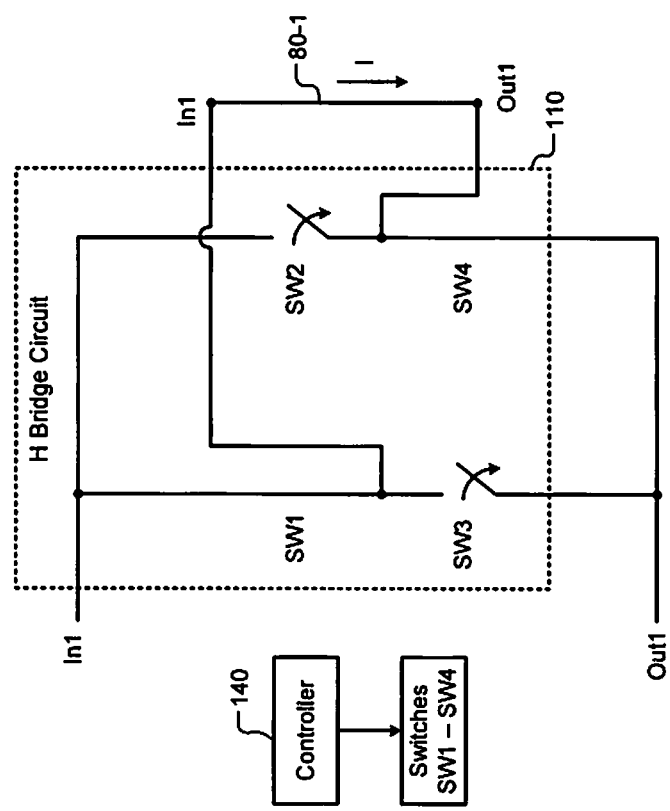

Referring now to FIGS. 6A and 6B, the H-bridge circuit 110 includes switches SW1, SW2, SW3, and SW4. In FIG. 6A, the switches SW1 and SW4 are in a closed state and the switches SW2 and SW3 are in an open state to flow current through the conductor 80-1 in a first direction from the input end $In_1$ to the output end $Out_1$. In FIG. 6B, the switches SW1 and SW4 are in an open state and the switches SW2 and SW3 are in a closed state to flow current through the conductor 80-1 in a second direction from the output end $Out_1$ to the input end $In_1$. A controller 140 may be used to control states of the switches SW1, SW2, SW3, and SW4. Examples of switches SW1, SW2, SW3, and SW4 include high voltage, high current PIN diode switches and high voltage, high current field effect transistors (FETs).

Figure 7B:
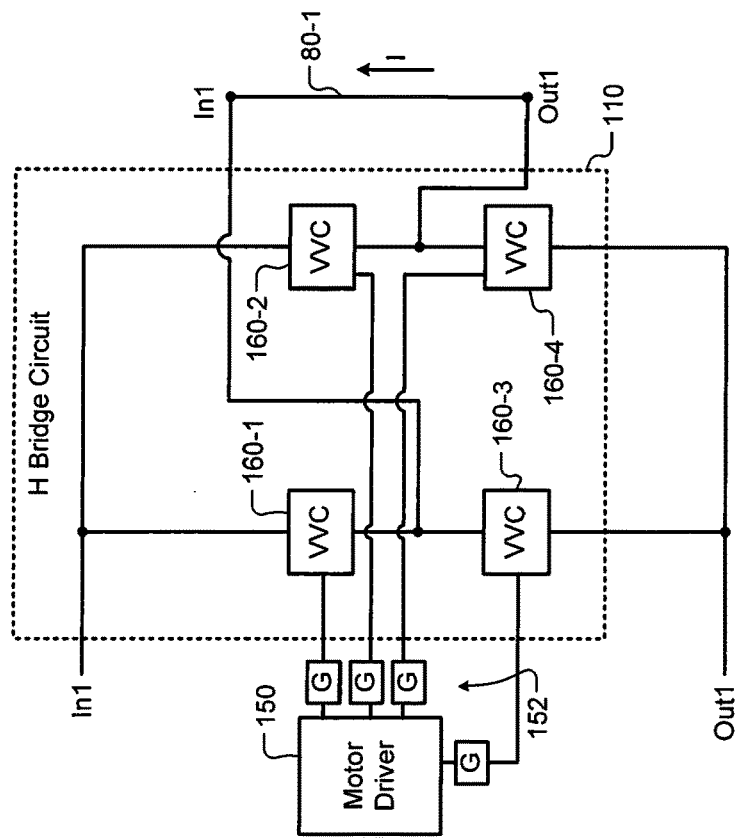
FIGS. 7A and 7B are electrical schematics of an example of an H-bridge circuit including a motor drive and variable vacuum capacitors.
Figure 7A:
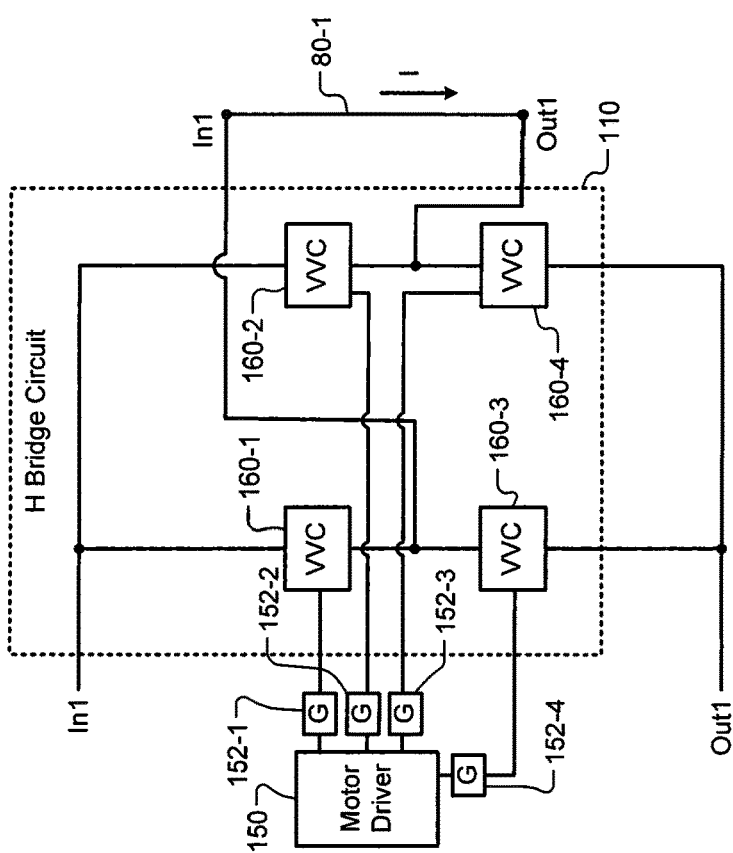

Referring now to FIGS. 7A and 7B, the H-bridge circuit 110 includes a motor driver 150, gears 152-1, 152-2, 152-3 and 152-4 (collectively gears 152) and variable vacuum capacitors (VVC) 160-1, 160-2, 160-3, and 160-4. In FIG. 7A, the motor driver 150 drives the VVC 160-1 and 160-4 using gears 152-1 and 152-4 to a low impedance state and the VVC 160-2 and 160-3 using gears 152-2 and 152-3 to a high impedance state to flow current through the conductor 80-1 in a first direction from the input end $In_1$ to the output end $Out_1$. In FIG. 7B, the motor driver 150 drives the VVC 160-1 and 160-4 using gears 152-1 and 152-4 to a high impedance state and the VVC 160-2 and 160-3 using gears 152-2 and 152-3 to a low impedance state to flow current through the conductor 80-1 in a second direction from the output end $Out_1$ to the input end $In_1$.

In this example, the VVCs can be linked to the same motor driver 150 (or two or more motor drivers) with gearing such that two of the VVCs are driven to a minimum capacitance while the other two of the VVCs are driven to a maximum capacitance. Use of the VVCs in this way mimics variation of a switch element from low to high impedance and approximates normal relay operation.

Figure 8A:
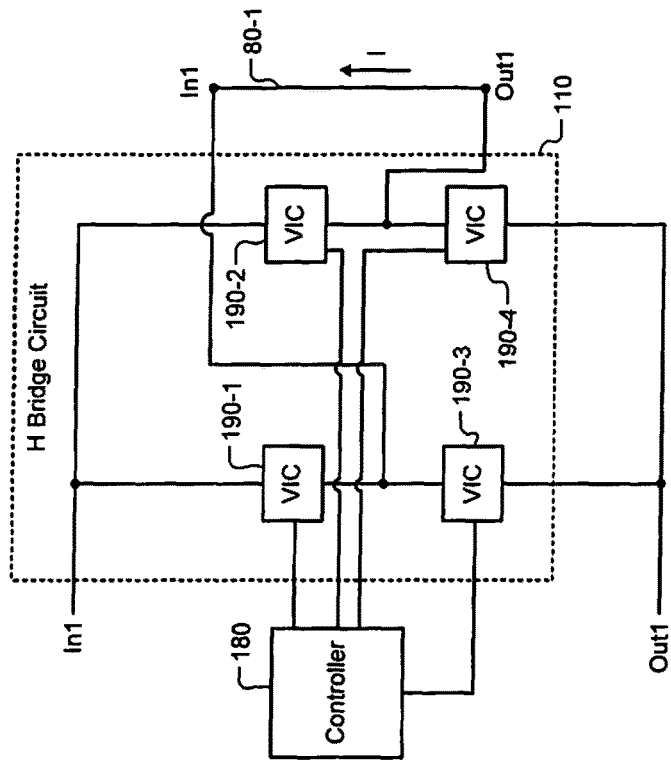
FIGS. 8A to 8D are electrical schematics of an example of an H-bridge circuit including a controller and variable capacitors or series/parallel resonant circuits.
Figure 8C:
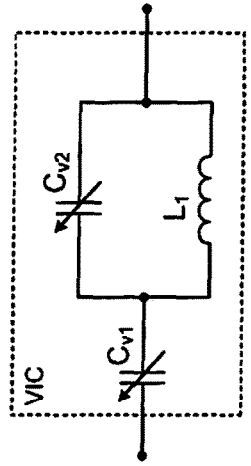
Figure 8B:
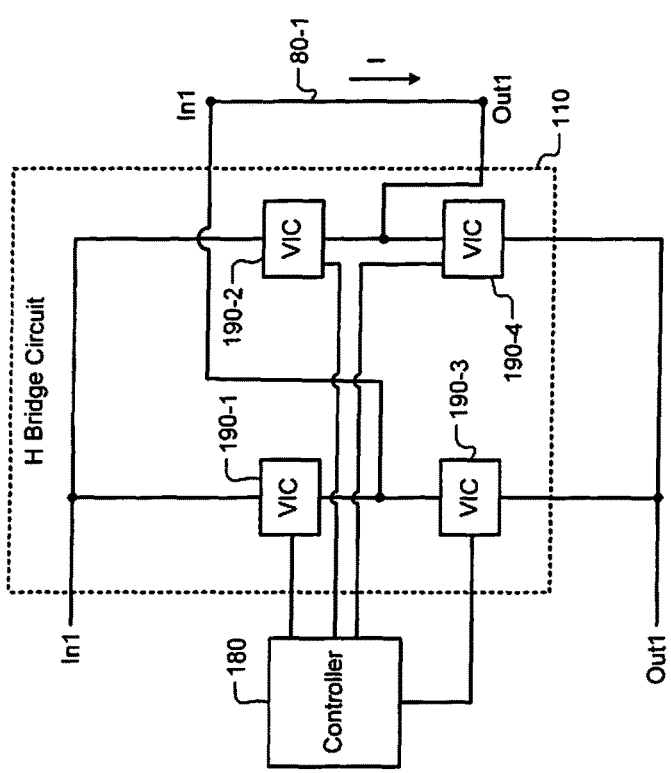

Referring now to FIGS. 8A to 8D, the H-bridge circuit 110 includes a controller 180 and variable impedance circuits 190-1, 190-2, 190-3 and 190-4 (collectively variable impedance circuits 190). In FIG. 8A, the controller 180 sets the variable impedance circuits 190-1 and 190-4 to a low impedance state and the variable impedance circuits 190-2 and 190-3 to a high impedance state to flow current through the conductor 80-1 in a first direction from the input end $In_1$ to the output end $Out_1$. In FIG. 8B, the controller 180 sets the variable impedance circuits 190-1 and 190-4 to a high impedance state and the variable impedance circuits 190-2 and 190-3 to a low impedance state to flow current through the conductor 80-1 in a second direction from the output end $Out_1$ to the input end $In_1$.

Figure 8D:
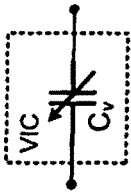

In FIG. 8C, an example of the variable impedance circuit 190 includes a variable capacitor Cv. In FIG. 8D, an example of the variable impedance circuit 190 includes a first variable capacitor Cv1 in series with a parallel combination of a second variable capacitor Cv2 and an inductor L1. In some examples, the variable impedance circuits 190 vary from nearly 0 Ohms to very large impedances on order 103 Ohms.

During operation, the motor driver or the controller can switch between driving current in the same direction through both of the coils or reversing the direction of current through one of the coils.

The relays and rotary switches provide mechanical switch implementations of the H-bridge circuits. These implementations may require RF power to be turned off prior to switch operation in order to avoid arcing at switch contacts of the relays and rotary switches. The remaining H-bridge implementations described herein allow the flexibility to switch operation while RF power is being supplied.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing tool for processing a substrate, comprising:
    a processing chamber including a substrate support;
    first and second coils arranged outside of the processing chamber,
    wherein each of the first and second coils include first and second conductors,
    wherein (i) the first conductor of the first coil is interwound with the second conductor of the first coil, and
    wherein (ii) the first conductor of the second coil is interwound with the second conductor of the second coil;
    a coil driving circuit to drive current through the coils to generate plasma in the processing chamber; and
    a coil reversing circuit configured to selectively reverse a polarity of current flowing through the first and second conductors of the first coil,
    wherein the coil reversing circuit includes an H-bridge circuit, and
    wherein the first and second conductors of the first coil are connected in parallel to the H-bridge circuit.

2. The substrate processing tool of claim 1, wherein the H-Bridge circuit includes a double-pole, double-throw relay.

3. The substrate processing tool of claim 1, wherein the H-Bridge circuit includes a first single-pole, double-throw relay and a second single-pole, double-throw relay.

4. The substrate processing tool of claim 1, wherein the H-Bridge circuit includes:
    first, second, third and fourth switches; and
    a controller configured to selectively switch states of the first, second, third and fourth switches.

5. The substrate processing tool of claim 4, wherein the first, second, third and fourth switches include field effect transistors (FETs).

6. The substrate processing tool of claim 4, wherein the first, second, third and fourth switches include PIN diodes.

7. The substrate processing tool of claim 1, wherein the H-Bridge circuit includes a rotary switch.

8. The substrate processing tool of claim 1, wherein the H-Bridge circuit includes:
    first, second third and fourth variable vacuum capacitors; and
    a motor driver configured to drive gears to selectively adjust an impedance of the first, second third and fourth variable vacuum capacitors.

9. The substrate processing tool of claim 1, wherein the H-Bridge circuit includes:
    first, second third and fourth variable impedance circuits; and
    a controller configured to selectively adjust an impedance of the first, second third and fourth variable impedance circuits.

10. The substrate processing tool of claim 9, wherein the first, second third and fourth variable impedance circuits include a variable capacitance.

11. The substrate processing tool of claim 9, wherein the first, second third and fourth variable impedance circuits include a first variable capacitance in series with a parallel combination of a second variable capacitance and an inductance.

12. The substrate processing tool of claim 1, wherein the coil driving circuit comprises:
    an RF source; and
    a tuning circuit in communication with the RF source, the coil reversing circuit and the second coil.

13. The substrate processing tool of claim 12, wherein the tuning circuit includes a transformer capacitively coupled tuning circuit.

14. The substrate processing tool of claim 12, wherein the first coil is arranged inside of the second coil.

15. The substrate processing tool of claim 12, wherein the first coil is arranged outside of the second coil.

16. The substrate processing tool of claim 1 wherein the first and second conductors of the second coil and the H-bridge circuit are connected in parallel to a tuning circuit.

17. The substrate processing tool of claim 1 wherein:
    input ends of the first and second conductors of the first coil are located radially inwardly from output ends of the first and second conductors of the first coil;
    input ends of the first and second conductors of the second coil are located radially outwardly from the output ends of the first and second conductors of the first coil; and
    the input ends of the first and second conductors of the second coil are located radially inwardly from output ends of the first and second conductors of the second coil.

18. The substrate processing tool of claim 1 wherein the first and second conductors of the first coil are arranged radially inwardly of the first and second conductors of the second coil.

* * * * *